United States Patent [19]
Yang et al.

[11] Patent Number: 5,422,605
[45] Date of Patent: Jun. 6, 1995

[54] LOW-NOISE PUSH-PULL CRYSTAL OSCILLATOR

[75] Inventors: Steve S. Yang, Chatsworth; Yiu-Man So, West Hills, both of Calif.

[73] Assignee: Hughes Missile Systems Company, Los Angeles, Calif.

[21] Appl. No.: 210,482

[22] Filed: Mar. 21, 1994

[51] Int. Cl.6 .............................................. H03B 5/36
[52] U.S. Cl. ................... 331/116 R; 331/75; 331/114; 331/177 V
[58] Field of Search ............ 331/114, 116 R, 116 FE, 331/177 V, 74–77, 158, 159, 117 R

[56] References Cited

U.S. PATENT DOCUMENTS

| | | | |
|---|---|---|---|
| 3,299,371 | 1/1967 | Ryan | 331/117 X |
| 3,839,685 | 10/1974 | Borsa et al. | 331/114 |
| 5,010,308 | 4/1991 | Cowley | 331/75 X |
| 5,063,359 | 11/1991 | Leonowich | 331/116 FE |
| 5,081,430 | 1/1992 | Kohsiek | 331/116 R |

*Primary Examiner*—Siegfried H. Grimm
*Attorney, Agent, or Firm*—Charles D. Brown; Randall M. Heald; Wanda K. Denson-Low

[57] ABSTRACT

A low phase noise oscillator 10 having a balanced feedback transformer 24 and a push-pull resonant circuit 12 for generating an oscillation excitation signal. The resonant circuit 12 is loaded by an output buffer 20 connected between first and second feedback terminals 16 and 18. The feedback transformer 24 provides first and second feedback paths of opposite phase polarity which link the resonant circuit 12 with the first and second feedback terminals 16 and 18.

4 Claims, 2 Drawing Sheets

LOW-NOISE PUSH-PULL CRYSTAL OSCILLATOR

BACKGROUND OF THE INVENTION

1. Field of the Invention

This invention relates to electronic oscillators. More specifically, this invention relates to low-phase noise oscillators utilized in sensitive radar systems and the like.

While the present invention is described herein with reference to a particular embodiment, it is understood that the invention is not limited thereto. Those having ordinary skill in the art and access to the teachings provided herein will recognize additional embodiments within the scope thereof.

2. Description of the Related Art

Sophisticated radar and communications schemes often require the detection of relatively faint or noise-obscured signals. As a result, advanced radar systems have become extremely sensitive to detect signals reflected by small targets and by targets operating in adverse environmental conditions.

Such advanced systems typically include a wide dynamic range receiver and a low phase noise frequency reference unit. Of central importance to the sensitivity of such systems is the capability of the frequency reference unit to generate or synthesize a highly stable designated frequency. A highly stable (low phase noise) frequency corresponds to one in which substantially all signal energy is confined to an extremely low spectrum deviation.

Many widely-used frequency reference units incorporate one of a variety of conventional oscillator circuits. Among the oscillator networks most frequently employed are those commonly known as Pierce, Colpitts, Clapp and Butler oscillators. Unfortunately, it is anticipated that future high frequency radar designs will require oscillators having a lower phase noise than that exhibited by the conventional networks enumerated above. For example, conventional oscillators are generally characterized by phase noise in excess of $-160$ dBc/Hz at a 20 kHz offset from oscillation frequencies ($f_0$) exceeding 100 MHz. In contrast, future high frequency coherent radar designs may be expected to impose noise requirements of better than $-170$ dBc/Hz at a 20 kHz frequency offset.

Conventional oscillators may also be characterized as either balanced or unbalanced. In balanced configurations, signals within the oscillator combine so as to reduce the amplitude level of the even harmonics and offer better noise performance thereof.

Accordingly, a need in the art exists for a low phase noise balanced oscillator disposed to initiate oscillation without the aid of external circuitry.

SUMMARY OF THE INVENTION

The aforementioned need in the art for a low phase noise oscillator is addressed by the present invention which includes a source of electrical energy, a resonator for providing an oscillatory signal in response to the electrical energy; and differential circuitry for transforming the oscillatory signal into first and second differential output signals.

In a particular implementation, the invention includes a current source for providing the electrical energy. An inductor splits the electrical energy into first and second paths. The resonator is connected between the first and second paths and provides an oscillatory signal in response to the current from the current source. The differential circuitry for transforming the oscillatory signal to first and second differential signals includes first and second transistors arranged in a push-pull configuration. A feedback circuit provides first and second output signals to the input terminals of the first and second transistors. The outputs of the first and second transistors are summed to provide a single low-noise balanced output signal.

Numerous additional features of the invention will be clear from the following disclosure.

DETAILED DESCRIPTION OF THE INVENTION

Figure 1:
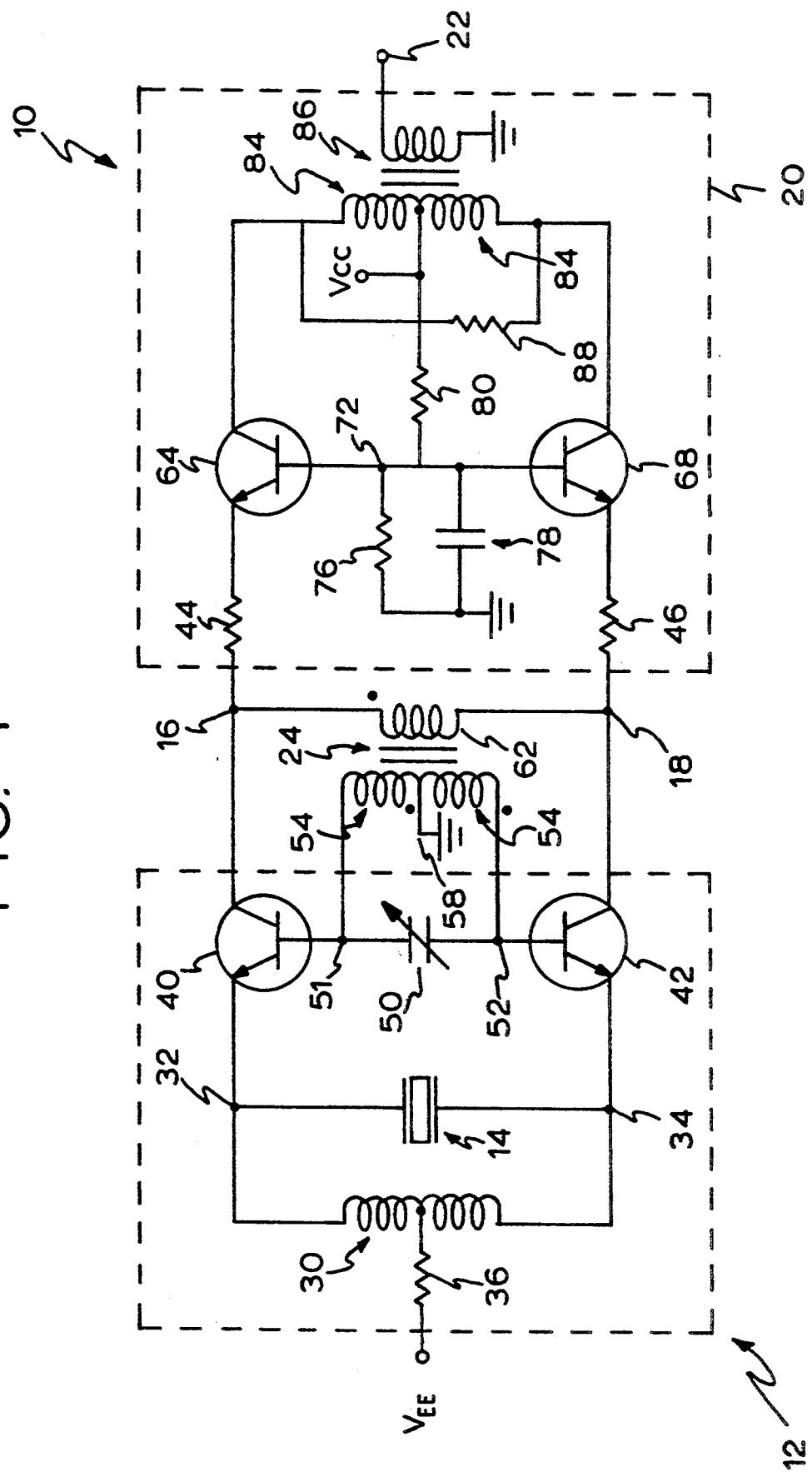
FIG. 1 is a schematic representation of a preferred embodiment of the inventive low phase noise balanced oscillator circuit.

FIG. 1 is a schematic representation of a preferred embodiment of the inventive low phase noise balanced oscillator circuit 10. As shown in FIG. 1, the oscillator 10 of the present invention includes a push-pull primary circuit 12 for impressing an oscillation excitation signal at the frequency of a crystal oscillator 14 across first and second feedback terminals 16 and 18. The primary circuit 12 is loaded by a push-pull output buffer 20 adapted to isolate the circuit 12 from an output terminal 22. As is described hereinafter, a balanced feedback transformer 24 suspended between the first and second feedback terminals 16 and 18 provides positive feedback between the buffer 20 and the primary circuit 12 sufficient to sustain oscillation within the inventive circuit 10. In this manner, the inventive circuit 10 is disposed to utilize the power gain of the output buffer 20 to impress an oscillatory signal on the output terminal 22.

Referring to FIG. 1, the crystal resonator 14 and an auto-inductor 30 are connected between first and second circuit nodes 32 and 34 of the circuit 12. The auto-inductor 30 is center-tapped by a biasing resistor 36 coupled to a voltage source $V_{EE}$. In addition to blocking the AC exciting signal to the source $V_{EE}$, the auto-inductor 30 cancels the stray capacitive reactance of the crystal oscillator 14.

As indicated in FIG. 1, the resonator 14 links the emitters of first and second bipolar push-pull transistors 40 and 42. The bias current through the first and second transistors 40 and 42 is primarily determined by the values of the biasing resistor 36 and the voltage source $V_{EE}$. During operation, the bias current through the push-pull transistors 40 and 42 regulates the amplitude of oscillations within the inventive circuit 10. It is thus a feature of the present invention that control of oscillation levels may be conveniently effectuated by adjustment of a single biasing resistor 36.

In the preferred embodiment of the inventive oscillator 10 a variable capacitor 50 links first and second base terminals 51 and 52 of the first and second transistors 40 and 42. In addition, the capacitor 50 is connected across a transformer secondary winding 54 having a grounded center tap 58 to form a balanced feedback. The transformer 24 further includes a primary winding 62 giving rise to a primary/secondary turns ratio of N:1.

Again with reference to FIG. 1, the output buffer 20 is in communication with the first and second feedback terminals 16 and 18 via the first and second loading resistors 44 and 46. The loading resistors 44 and 46 are also connected to the emitter terminals of third and fourth bipolar push-pull transistors 64 and 68. The third and fourth transistors 64 and 68 are connected in a common base configuration to a bias node 72. As shown in FIG. 1, a first common base bias resistor 76 and a DC decoupling capacitor 78 are connected between the bias node 72 and ground. A bias voltage is impressed on the node 72 by an output source $V_{cc}$ linked thereto by a second common-base biasing resistor 80.

The second biasing resistor 80 also taps the center of a primary winding 84 of an output transformer 86. The output transformer 84 has a turns ratio of N:1 and includes a secondary winding 86 coupled to the output terminal 22. The output buffer 20 further includes an impedance matching resistor 88 connected between the primary terminals of the output transformer 84 and the collectors of the third and the fourth push-pull transistors 64 and 68.

Referring to FIG. 1, the common-base configuration of the push-pull output buffer 20 yields a high collector output impedance and a low emitter input impedance. This implementation allows for an effective output/input impedance ratio in excess of approximately thirty, thereby ensuring sufficient isolation of the output terminal 22 from the remainder of the oscillator 10. Moreover, the buffer 20 is capable of providing a large output voltage swing since signals at the emitter and collector of the third and fourth transistors 64 and 68 are in phase.

As may be appreciated upon inspection of FIG. 1, first and second matched feedback paths exist within the oscillator 10. Specifically, a first feedback path runs from the first feedback terminal 16 via the transformer 24 to the second base terminal 52. Similarly, the second feedback path extends from the second feedback terminal 18 to the first base terminal 51. It follows that signals traversing the first and second feedback paths are disposed to undergo equal but oppositely-directed phase shifts through the feedback transformer 24. In addition, the first and second transistors 40 and 42 act in a complementary "push-pull" fashion to simultaneously drive the signal polarity at the first and second feedback terminals 16 and 18 in opposite directions. In this manner, the positive feedback necessary to establish oscillation within the circuit 10 is provided by the transformer 24 and the transistors 40 and 42.

Auxiliary circuitry is often required to trigger oscillation within conventional balanced oscillators. In contrast, component values may be chosen for the present invention such that external exciting circuitry is not required to induce oscillation at the frequency of the crystal 14. The self-oscillation feature of the present invention may be more fully understood by reference to the following derivation of $v_c/v_b$, wherein $v_c$ denotes the voltage between the feedback terminals 16 and 18 and $v_b$ corresponds to the voltage magnitude across the bases of the first and second transistors 40 and 42.

The voltage $v_e$ across the crystal oscillator 14 may be expressed as:

$$v_e = G_v(v_b + Nv_c) \quad [1]$$

in which $G_v$ refers to the base/emitter voltage gain of the first and second transistors 40 and 42 and N refers to the turns ratio of the feedback transformer 24. In the preferred embodiment of FIG. 1, it is contemplated that a feedback turns ratio of 2:1 may be used to induce the requisite positive feedback for self-oscillation. Moreover, $$v_e = i_e Z_e \quad [2]$$

wherein $i_e$ denotes the alternating current, and $Z_e$ the impedance, through the emitters of the first and second transistors 40 and 42. Combining equations [1] and [2] yields:

$$v_e = i_e Z_e = G_v(v_b + Nv_c) \quad [3]$$

Similarly, the current $i_c$ through the collectors of the first and second transistors 40 and 42 may be expressed as:

$$i_c = G_i i_e \quad [4]$$

wherein $G_i$ is the emitter/collector current gain. Substituting equation [3] into equation [4] gives:

$$i_c = G_i G_v(v_b + Nv_c)/Z_e \quad [5]$$

The voltage $v_c$ may also be written as:

$$v_c = i_c Z_1 \quad [6]$$

wherein $Z_1$ is the loading resistance between the first and second feedback terminals 16 and 18. The value of $Z_1$ will be dominated by the loading resistors 44 and 46 in series with the emitter input impedance of the third and fourth push-pull transistors 64 and 68. Accordingly, inserting equation [5] into equation [6] yields:

$$v_c/Z_1 = G_i G_v(v_b + Nv_c)/Z_e \quad [7]$$

Simplifying, $$v_c/v_b = G_i G_v/(Z_e - NG_i G_v Z_1) \quad [9]$$

During oscillation equation [8] will approach a value less than or equal to zero. It follows that the inventive circuit 10 will oscillate under the condition of:

$$NG_i G_v Z_1 \geq Z_e \quad [9]$$

The nominal values of $G_i$ and $G_v$ in conventional bipolar transistors range from approximately 0.9 to 1.0. As mentioned above, the value of $Z_1$ is dependent upon the values of the AC loading resistors 44 and 46. It follows that self-oscillation may be effectuated within the inventive circuit 10 by adjusting the values of the turns ratio N and the loading resistors 44 and 46.

In particular instances, it may be advantageous to reduce the number of resistive circuit elements of an oscillator network in order to minimize power consumption and associated heat generation. As is evident upon inspection of FIG. 1, the transformer 24 provides positive feedback without utilizing resistive components. In contrast, conventional oscillators generally require a plurality of circuit elements to perform a similar feedback function. In this manner, the relatively low number of circuit elements employed within the present invention results in reduced power consumption as well as in diminished parasitic noise induction.

The signal-to-noise ratio of the inventive oscillator 10 is also enhanced by the unique combination of the push-pull output buffer 20 with the resonant circuit 12 via the transformer 24. In particular, the first, second, third and fourth push-pull transistors 40, 42, 64 and 68 each produce solid-state noise upon being energized. However, since this noise energy is incoherent it will not be coherently combined at the transformer 24. In contrast, the oscillatory exciting signal generated by the circuit 12 coherently reinforces the oscillation signal fed back from the output buffer 10 at the transformer 24. It follows that the transformer 24 operates to augment the power of coherent oscillatory signal energy by approximately 3 dB relative to incoherent noise from the push-pull transistors. Accordingly, the unique circuit topology of the inventive oscillator 10 is seen to improve the signal-to-noise ratio of the output signal impressed upon the terminal 22.

Although the transformer 24 provides sufficient signal feedback to induce oscillation within the inventive circuit 10, the magnitude of the feedback voltage may be controlled by adjusting the values of the first and second loading resistors 44 and 46. Specifically, the amount of feedback voltage transferred to the base terminals 51 and 52 of the first and second push-pull transistors 40 and 42 by the transformer 24 will be dependent on the values of the loading resistors 44 and 46 if such values are chosen to be substantially less than the collector output impedance of the first and second push-pull transistors 40 and 42. Accordingly, the present invention allows the loop gains associated with the first and second feedback paths to be conveniently adjusted without affecting other circuit parameters of the inventive oscillator. Moreover, the inclusion of the variable capacitor 50 in combination with the transformer 24 simplifies the realization of the preferred embodiment of FIG. 1. Specifically, tuning of the oscillator 10 during fabrication requires adjustment only of the variable capacitor 50, thus reducing production costs and complexity.

Figure 2:
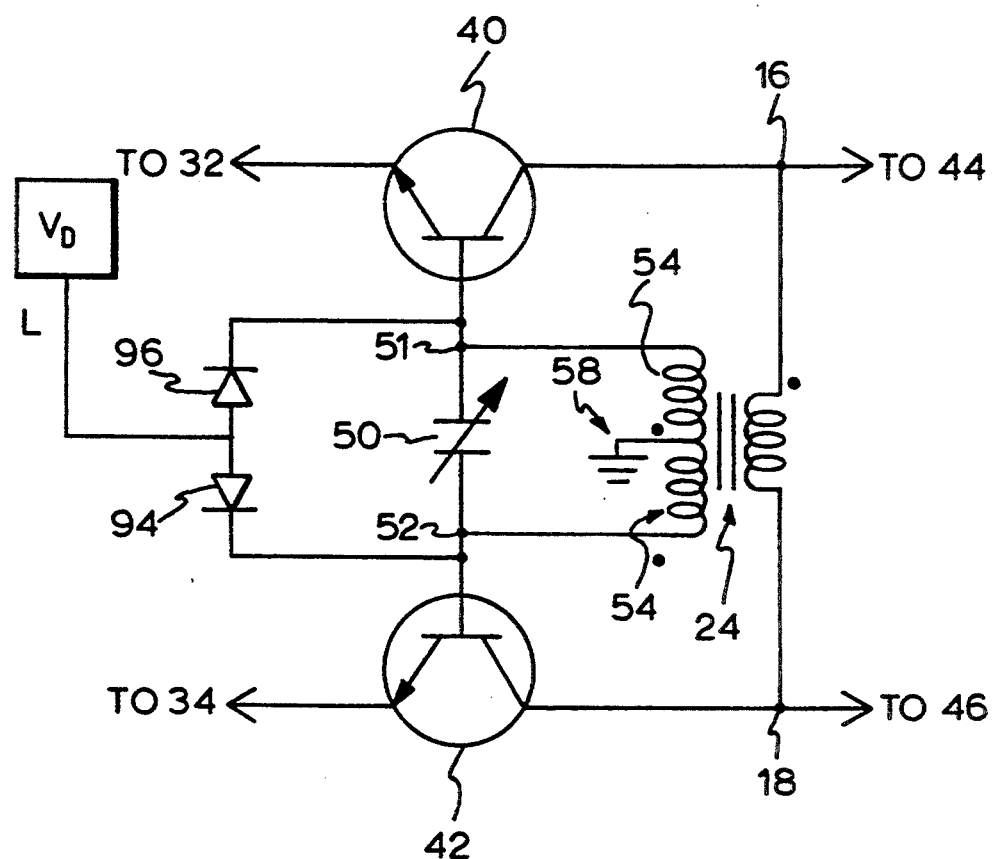
FIG. 2 is a schematic representation of a portion of an alternately preferred embodiment of the inventive oscillator incorporating a diode network in parallel with a feedback transformer.

As shown in the schematic representation of FIG. 2, tuning of the oscillator of the present invention may be further facilitated by placing first and second varactor diodes 94 and 96 between the first and second base terminals 51 and 52 of the first and second transistors 40 and 42. Referring to FIG. 2, the diodes 94 and 96 are connected in a back-to-back manner to a diode bias source $V_D$. The employment of the first and second diodes 94 and 96 allows for fine-tuning of the frequency of the output signal impressed on the output terminal 22 (FIG. 1). Specifically, the magnitude of the bias source $V_D$ is adjusted in order to change oscillation frequency at crystal 14. This adjustment results in perturbation of the oscillation frequency of the crystal at the parallel resonator of terminals 51 and 52 thereof, thus yielding a corresponding modification in the frequency of the output signal. In this manner, the circuit of the present invention may be utilized as a voltage-controlled crystal oscillator.

While the present invention has been described herein with reference to a particular embodiment, it is understood that the invention is not limited thereto. The teachings of this invention may be utilized by one having ordinary skill in the art to make modifications within the scope thereof. In this regard the invention is not limited to the particular hardware implementations of the push-pull resonant circuit and push-pull output buffer given herein. For example, both push-pull configurations may be realized using metal oxide semiconductor field-effect transistors (MOSFET's) rather than bipolar devices. Similarly, the turns ratio of the feedback transformer may be adjusted in conjunction with selection of values for the AC loading resistors in order to control the degree of positive feedback within the inventive oscillator. In like manner the turns ratio of the output transformer will generally be chosen so as to match the output impedance of the inventive oscillator with the impedance of a load coupled to the output terminal 22. Moreover, a dielectric or SAW resonator rather than a crystal oscillator may be incorporated into the resonant circuit without departing from the scope of the present invention.

It is therefore contemplated by the appended claims to cover any and all such modifications.

Accordingly,

What is claimed is:

1. A low noise oscillator comprising:
   a current source for providing electrical energy;
   inductive means for splitting said electrical energy into first and second paths;
   resonator means for providing an oscillatory signal in response to said electrical energy;
   differential means for transforming said oscillatory signal to first and second differential signals, said differential means including first and second transistors arranged in a push-pull configuration;
   feedback means for providing said first and second differential signals to input terminals of said first and second transistors, said feedback means including a transformer having a primary winding connected between the output terminals of said transistors and a secondary winding connected between the input terminals of said transistors and a tuning capacitor connected across said secondary winding;
   means for summing the first and second differential signals into a single output signal; and
   means for adjusting the levels of said feedback signals including a first resistor connected between the output of said first transistor and the output of said oscillator and a second resistor connected between the output of said second transistor and the output of said oscillator.

2. The invention of claim 1 including buffer means for buffering said first and second differential signals.

3. The invention of claim 2 wherein said buffer means includes first and second transistors arranged in a push-pull configuration.

4. The invention of claim 1 including means for adjusting the output impedance of said low noise oscillator.

* * * * *